United States Patent

Lei et al.

Patent Number: 5,298,896
Date of Patent: Mar. 29, 1994

[54] METHOD AND SYSTEM FOR HIGH ORDER CONDITIONAL ENTROPY CODING

[75] Inventors: Shaw-Min Lei, Tinton Falls; Ming-Ting Sun, Holmdel, both of N.J.; Kou-Hu Tzou, Potomac, Md.

[73] Assignee: Bell Communications Research, Inc., Livingston, N.J.

[21] Appl. No.: 31,421

[22] Filed: Mar. 15, 1993

[51] Int. Cl.⁵ ............................................. H03M 7/30
[52] U.S. Cl. ...................................... 341/51; 341/79; 341/107; 348/384
[58] Field of Search ............... 341/51, 79, 106, 107; 358/133

[56] References Cited

U.S. PATENT DOCUMENTS

| | | | |
|---|---|---|---|
| 4,613,948 | 9/1986 | Gharavi | 364/526 |
| 4,727,354 | 2/1988 | Lindsay | 341/106 |
| 4,965,580 | 10/1990 | Tasaki et al. | 341/200 |
| 5,023,611 | 6/1991 | Chamzas et al. | 341/51 |
| 5,031,037 | 7/1991 | Israelsen | 358/133 |
| 5,173,695 | 12/1992 | Sun et al. | 341/67 |
| 5,247,357 | 9/1993 | Israelsen | 358/133 |

OTHER PUBLICATIONS

"Entropy Coding for Low-Bit-Rate Visual Telecommunications", Sharaf E. Elnahas and James G. Dunham, 1987 IEEE (Aug. 1987) pp. 175–183.
"A High Order Entropy Coding for Video Applications", Kou-Hu-Tzou, IEEE Workshop on Visual Signal Processing and Communications, Jun. 6–7, 1991, pp. 1–4.
"An Entropy Coding System for Digital HDTV", Shaw-Min Lei and Ming-Ting Sun, IEEE Transactions on Circuits and Systems for Video Technology, vol. 1, No. 1, Mar. 1991.
"Conditional Entropy Coding of Digital Pictures", H. Gharavi, IERE Conference of Digital Processing of Signals in Communications held at Loughborough, Apr. 1985.

Primary Examiner—Marc S. Hoff
Attorney, Agent, or Firm—Leonard Charles Suchyta

[57] ABSTRACT

Method and system for high order conditional entropy coding utilizing an incremental-tree-extension technique to design a conditional tree for the coding. For complexity reduction, code table reduction and non-uniform quantization of conditioning symbols or pixels is provided. A pattern matching technique is provided for fast conditioning state extraction, and a multistage pipelined structure is provided to handle the case of a large number of conditioning pixels. Using the complexity reduction techniques and the hardware structures, it is possible to implement practical high order conditional entropy codecs using current low-cost VLSI (Very Large Scale Integration) technology.

16 Claims, 6 Drawing Sheets

METHOD AND SYSTEM FOR HIGH ORDER CONDITIONAL ENTROPY CODING

TECHNICAL FIELD

This invention relates to data compression methods and system and, in particular, to methods and systems for high order conditional entropy coding.

BACKGROUND ART

Entropy coding is a technique of lossless data compression which achieves compact data representation by taking advantage of the statistical characteristics of the source. Today, the most practiced entropy coding technique is probably variable-length coding (VLC). VLC translates input data, often in a fixed length format, into codes of variable lengths. The basic concept behind variable-length coding is to represent more frequent data by shorter codes and less frequent data by longer codes. Therefore, the average code length is expected to be shorter than that of the fixed length representation.

VLC is widely used in various data compression applications and has been adopted in many international standards such as facsimile, still picture, and video coding. The VLCs used by these standards mostly utilize only zero-order or low-order statistical characteristics of the source.

A well-known theorem in information theory implies that the coding efficiency can be improved by utilizing high-order statistics. However, due to the high complexity associated with high-order statistics and the lack of high-speed hardware to implement it, high-order entropy coding has not been practical in the past. In other words, high order conditional entropy coding has not been practical due to its high complexity and the lack of hardware to extract the conditioning state efficiently. High-order conditional entropy coding can also be viewed as an entropy coding system with multiple code tables, adaptively selected according to the state.

The high-order entropy of a source can be effectively exploited by using either the joint probability of L symbols or the conditional probability. However, both techniques would lead to very high complexity. Consequently, a simple but effective technique called run-length coding has been popularly used to exploit limited high-order redundancy. Run-length coding converts a string of the same symbols that occur consecutively into a new symbol that indicates the string length coding for further data compression. The combination of run-length coding and variable-length coding has been shown to achieve high performance for image applications. The entropy coding techniques adopted in most standards are variations of combined run-length coding and variable-length coding.

The benefit of using high-order statistics has been clearly demonstrated in Langdon and Rissanen's work on black/white document compression. In this work, the conditioning state was defined as the combination of 10 pixels in the causal region and a total of 1024 states were generated from all possible combinations of the 10 pixels. The associated coding technique was arithmetic coding which allows the use of fractional bits to code a sample. The drawback of this high-order conditional probability approach is the requirement of a large memory to store all the measured conditional probabilities. When this approach is extended to gray-level images or cases that utilize even higher-order statistics, the memory requirement becomes formidable.

The statistical nature of sources with independent samples can be fully exploited on a sample-by-sample basis. However, for correlated sources, high-order statistics have to be utilized to exploit the redundancy among the data. The minimum bit rate for representing a source is governed by the entropy of the source. For stationary sources, the first order entropy, H(X), is defined as:

$$H(X) = - \sum_{x} p(x) \log_2 p(x), \tag{1}$$

where p(x) is the probability of the source symbol x. The entropy H(X), in bits per symbol, establishes a lower bound on the average bit rate for the source X. This lower limit is achieved if each symbol can be coded by the ideal word length, $-\log_2 p(x)$. This is usually not the case for VLC since $-\log_2 p(x)$ may not be an integer. On the other hand, arithmetic coding allows one, in effect, to represent a symbol in fractional bits and results in a bit rate very close to the entropy. In practice, either technique can be used, whichever is more appropriate.

The U.S. Pat. No. 5,173,695, to Sun et al, discloses a high speed, parallel variable length decoder wherein VLC decoding is achieved in one clock cycle regardless of the code length.

Recently, a technique called incremental tree extension was developed which can substantially reduce the complexity of high-order conditional entropy coding. This technique has been modified for 2-D signals. Nevertheless, the storage requirement is still too high for high-speed implementation.

SUMMARY OF THE INVENTION

An object of the present invention is to provide a feasible method and system for high-order conditional entropy coding which lowers storage requirements for high-speed implementation.

Another object of the present invention is to provide a method and system for high order conditional entropy coding utilizing a code table reduction algorithm and non-uniform quantization of conditioning symbols.

Yet still another object of the present invention is to provide a method and system for high-order conditional entropy coding utilizing an incremental tree extension algorithm and architecture which allows a conditioning stage to be extracted using a pattern matching technique.

A further another object of the present invention is to provide a method and system for high-order conditional entropy coding utilizing code table reduction, non-uniform quantizing of conditioning symbols, a pattern matching technique for fast conditioning state extraction and a multi-stage pipelined structure to handle the case of a large number of conditioning symbols such as pixels.

In carrying out the above objects and other objects of the present invention, methods are provided for compressing and decompressing data in a data transmission system. The data compression method includes the step of generating a reduced number of code tables containing statistical information for translating between first and second sets of data. The first set of data represents source symbols and the second set of data represents corresponding coded bit streams. The data compression method also includes the steps of temporarily storing the source symbols to obtain a current symbol and its conditional symbols, generating a reduced number of conditioning states for the source symbols and non-uniformly quantizing the conditioning symbols to obtain quantized conditioning symbols. The data compression method further includes the steps of extracting a conditioning state from the reduced number of conditioning states based on the quantized conditioning symbols, selecting a code table from the reduced number of code tables based on the extracted conditioning state, determining a code from the selected code table for the current symbol, and encoding the current symbol based on the determined code to obtain a coded bit stream.

Preferably, the step of extracting includes the step of performing a multistage, parallel pattern matching algorithm to extract the conditioning state.

Also, preferably, the step of generating a plurality reduced number of conditioning states includes the steps of generating a plurality of conditioning states by an incremental tree extension algorithm and reducing the number of conditioning states to obtain the reduced number of conditioning states.

Further in carrying out the above objects and other objects of the present invention, a system is provided for carrying out each of the method steps.

A code table reduction algorithm reduces the storage requirement for a large number of code tables obtained through incremental tree extension. Simulation results have shown that this technique can reduce the number of code tables from several hundreds to several tens and suffer only a slight increase in bit rate. The non-uniform quantization of conditioning pixels can substantially reduce the address-bits of conditioning pixels and the number of conditioning states. For example, a total of 55 address-bits would be required if the state consisted of 11 conditioning pixels represented in 5 bits each. Through non-uniform quantization of conditioning pixels, the number can be reduced to 21 bits.

The conditioning states obtained by incremental tree extension have a variable number of conditioning pixels. In order to quickly determine the state, a novel architecture similar to that of the high-speed variable length decoder of U.S. Pat. No. 5,173,695 is provided. This patent is owned by the assignee of the present invention and is hereby expressly incorporated by reference in its entirety. This architecture allows a state to be quickly extracted using a pattern matching technique. Otherwise, a sequential decision approach would have to be used which needs several search steps to extract a state.

Another hardware innovation provided herein is the pipelined structure for multistage state extraction that can accommodate cases where the number of conditioning symbols is very large.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Data Compression Utilizing High-Order Statistics

Figure 1:
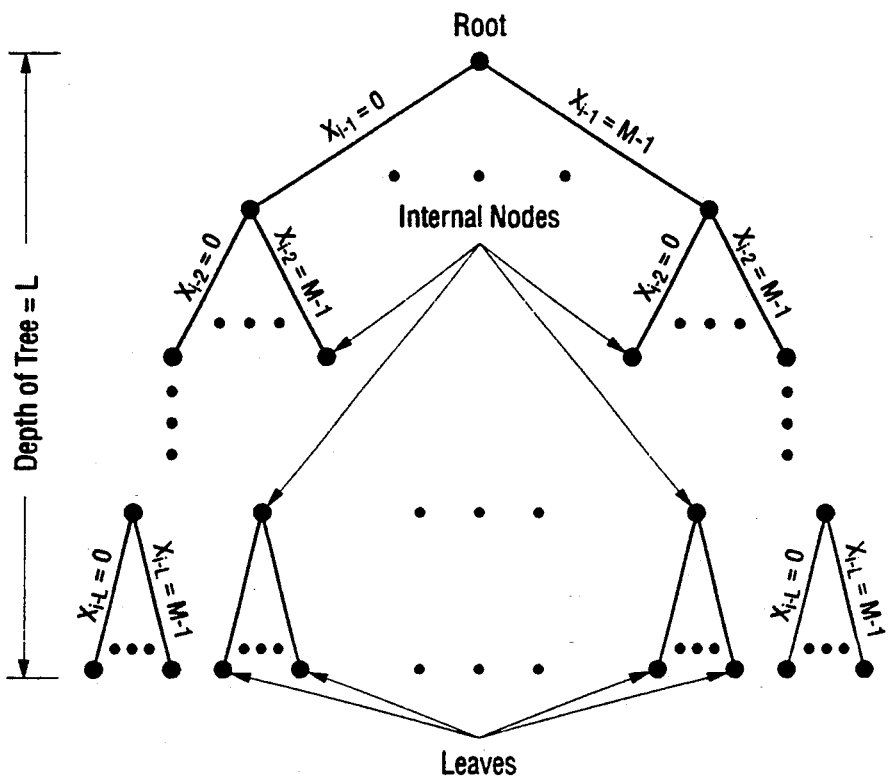
FIG. 1 illustrates an L-level full conditioning tree with M branches from each node wherein the root of the tree is shown on the top and the tree grows downward.

In high-order entropy coding, a block of multiple symbols can be combined as an extended symbol and coded by a single code. If L symbols are grouped as an L-dimensional vector, i.e., $x^L=(x_1, x_2, \ldots, x_L)$, the per-symbol entropy of this source, utilizing L-th order statistics is:

$$H_L(X) = -\frac{1}{L} \sum_{x^L} p(x^L) \log_2 p(x^L), \qquad (2)$$

where $p(x^L)$ is the probability of the L-dimensional stationary source. The advantage of using higher order statistics can be observed in the following well-known result in information theory:

$$H_L(X) \leq H_{L-1}(X) \leq \ldots \leq H_1(X) = H(X). \qquad (3)$$

Another form of the higher-order statistics is the L-th order conditional probability. In this notion of high-order statistical coding, the optimal word length to code the sample x is $-\log_2 p(x|s^L(x))$, where $p(x|s^L(x))$ is the L-th order conditional probability and $s^L(x)$ is the conditioning state defined by L samples, i.e., $s^L(x)=(x'_1, x'_2, \ldots, x'_L)$, wehre $x'_i$ refers to a neighboring sample around x. For causal operation, the neighboring samples have to be taken from those previously coded. If the source is stationary, the persymbol entropy for the system utilizing the L-th order conditional probability is defined similarly, $$H_{x|s^L}(X) = - \sum_{s^L(x)} p(s^L(x)) \left[ \sum_x p(x|s^L(x)) \log_2 p(x|s^L(x)) \right] \qquad (4)$$

For an L-th order Markov source, the redundancy can be fully exploited using the L-th order conditional probability. Theorems in information theory also show the following relations:

$$H_{X|S^L}(X) \leq H_{X|S^{L-1}}(X) \leq \ldots ,$$
$$\leq H_{X|S^1}(X) \leq H_{X|S^0}(X) = H(X), \qquad (5)$$

$$H_{X|S^{L-1}}(X) \leq H_L(X). \quad (6)$$

The first result indicates that the higher the order of conditional probability, the lower the resulting entropy. The second result indicates that, if the statistics for L symbols are employed, the system employing the conditional probability can achieve lower entropy than that employing the L-dimensional probability. Another major advantage of employing the conditional probability is that a technique is available to substantially reduce the complexity of high-order conditional entropy coding. Conditional entropy coding is the approach hereinbelow described to the high-order statistical coding.

Complexity of High-Order Statistical Coding

To facilitate variable-length coding, a variable-length code table is required at both the encoder and decoder. Usually, the table consists of a list of translations between the source symbols and the variable-length codes. If the source symbol has M possible values, the VLC table requires the storage of M VLC code. For arithmetic coding, the probability of the symbol is needed for coding and decoding. Therefore, a table containing M probabilities is required at both the coder and the decoder.

As shown above, high-order conditional entropy coding can improve the efficiency. However, the complexity increases exponentially with the order. Conditional entropy coding can also be viewed as a kind of adaptive entropy coding, where the adaptivity is implemented through the conditioning state $s^L(x)$. In this notion, a VLC table or a probability table is required for each conditioning state. Consequently, a total of $M^L$ tables (each with M entries) will be required for the Lth-order conditional entropy coding, which becomes formidable for large L and M. For example, a prior art system employing only the second-order conditional probability would require 64k code tables (each with 256 entries) for conditioning pixels represented in 8 bits.

Conditioning Tree Design Using Incremental Tree Extension

In conditional entropy coding, the total possible combinations of the conditioning symbols may be numerous. However, due to the characteristics of the source, some combinations may rarely occur. Therefore, the adaptive use of individual tables for these conditioning states has little effect on the resulting bit rate. Thus, the infrequent conditioning states can be eliminated to reduce the complexity without significantly increasing the bit rate. In order to explore a systematic way to reduce the number of conditioning states, all the states are organized as leaves of an L-level full tree with M branches from each node as shown in FIG. 1, where the root of the tree is on the top and the tree grows downward. Conceptually, the state reduction process can be viewed as follows: If all the leaves from a node seldom occur or if their conditional probabilities are similar, these leaves can be merged back to their branching node and form a combined leaf. This process can be iteratively applied until the number of states is reduced to a desired figure. This approach is not practical since it has to start with a formidable full tree.

Figure 2A:
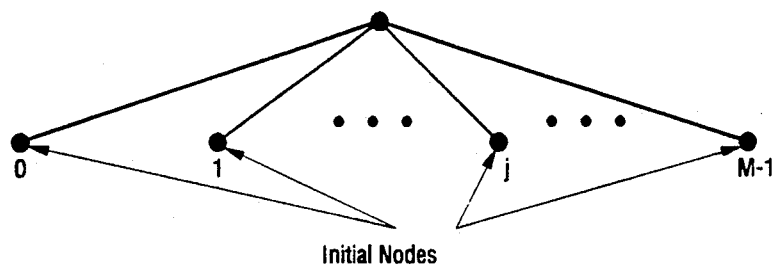
FIGS. 2a-2c illustrate incremental tree extension which starts with M initial leaves wherein during each iteration, M new leaves are extended from the leaf, denoted with an "*", which results in the maximum entropy reduction.
Figure 2B:
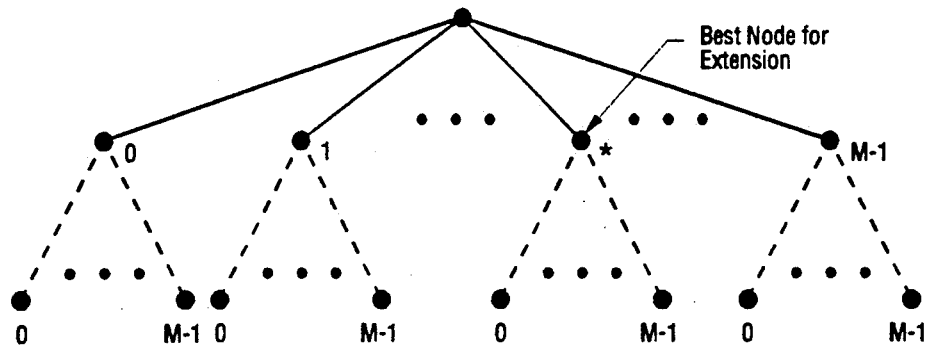
Figure 2C:
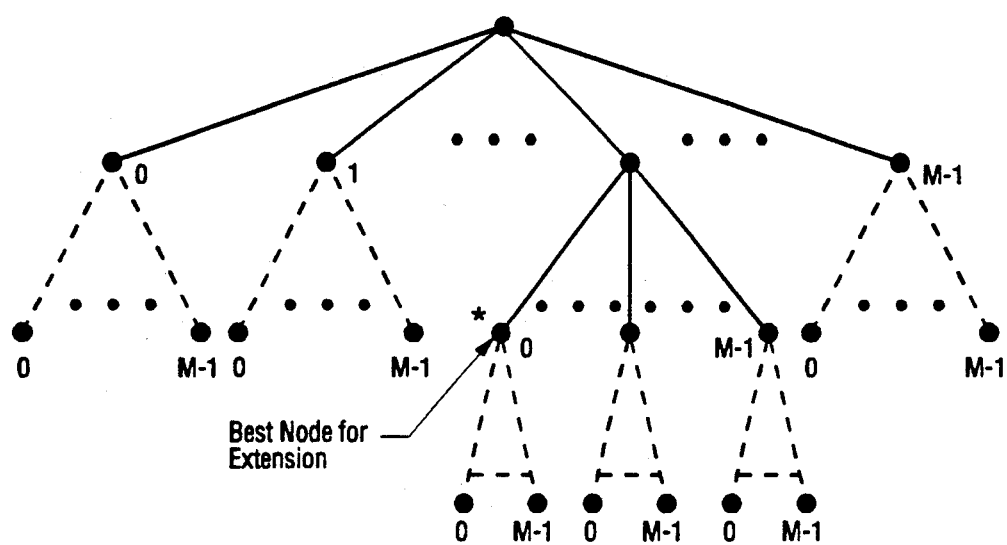
Figure 3:
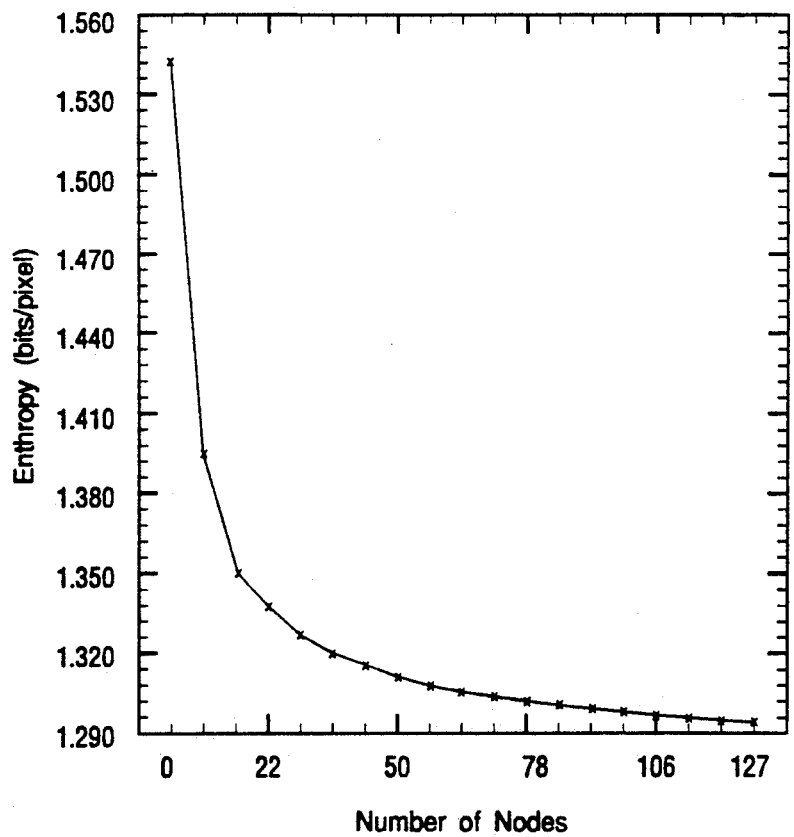
FIG. 3 is a graph of the conditional entropy versus the number of leaves as a result of the incremental tree extension for conditioning tree design.

As previously mentioned, a new approach to construct a tractable tree for conditioning states has been introduced and modified for 2-D sources. This approach starts with a first-order conditioning tree and then extends the tree iteratively by growing those branches from the leaf which results in maximum entropy reduction due to the extension of that leaf. This incremental tree extension method is exemplified in FIG. 2 for an M-ary source. The design procedure starts with a tree with M initial leaves, and all the M leaves are considered as candidates for extension. The conditional entropy, $H(X|t_i)$, associated with the leaf $t_i$, is defined as:

$$H(X|t_i) = -\sum_{j=0}^{M-1} p(x=j|t_i) \log p(x=j|t_i), \quad (7)$$

where $p(x=j|t_i)$ is the conditional probability for sample x having the value j. If the leaf $t_i$ is extended to $t_{ik}$, $k=0,1,\ldots,M-1$, the corresponding entropy, $H(X|t_{ik})$ can be calculated according to the above equation. The amount of reduction in entropy by extending the leaf $t_i$ is:

$$\Delta H(X|t_i) = p(t_i)H(X|t_i) - \sum_{k=0}^{M-1} p(t_{ik})H(X|t_{ik}), \quad (8)$$

where $p(t_i)$ is the probability of occurrence of conditioning state $t_i$ and $p(t_{ik})$ is the probability of occurrence of conditioning state $t_{ik}$. It can be shown that $\Delta H(X|t_i)$ is always greater than or equal to zero. The strategy of tree extension is to choose the leaf that results in the maximum entropy reduction. M new leaves are extended from the chosen leaf each time and the tree extension process iterates until the desired number of leaves is obtained. Hence, the incremental tree extension will result in a decreasing conditional entropy for increasing number of conditioning states. This is illustrated in FIG. 3, where the source is a differential image quantized to 8 levels.

The prior art shows an example using conditional entropy coding with 128 states which achieves more than 14% improvement in bit rate compared with the conventional run-length/VLC approach. Further improvement can be achieved with more conditioning states. Though the technique has substantially reduced the total number of states, from $8^{10}$ (M=9, L=10) to 128, the coder still requires 128 tables, each with 8 codes or probabilities. The situation becomes worse when the number of conditioning states or the number of pixel values increases. In order to make high-order conditional entropy coding practical for more general cases, further complexity reduction techniques as well as a novel hardware architecture are disclosed below.

The Reduction of Code Tables

The prior art disclosing conditional entropy coding assumed that different conditioning states used different code tables. For high-order coding schemes, the number of states is large and so is the number of code tables. It will require a lot of memory to store all these code tables.

However, as described below it is possible to drastically reduce the total number of code tables after the incremental tree extension procedure with little sacrifice in performance. The main idea of code table reduction is the merging of leaves with similar code tables and using one common code table for those states. Two code tables can be merged together either if they are similar or if one or both of the states occur rarely, as long as the total entropy increase is tolerable.

The Distance Measure Between Code Tables

The optimal code table of each state(s) is determined by the conditional probability distribution of the state, $p(x|s)$. The minimal achievable coding rate of this conditional coding scheme is:

$$- \sum_s p(s) \sum_x p(x|s) \log_2 p(x|s). \qquad (9)$$

If two code tables (with state $s_1$ and $s_2$) are merged together, the optimal common code table can be determined by the following probability distribution, $$p(x|s_1 \text{ or } s_2) = \frac{p(s_1)p(x|s_1) + p(s_2)p(x|s_2)}{p(s_1) + p(s_2)} \qquad (10)$$

The rate increase caused by this merge is equal to:

$$D(s_1, s_2) = M(s_1 \text{ or } s_2) - M(s_1) - M(s_2), \qquad (11)$$

where $$M(s) = -p(s) \sum_x p(x|s) \log_2 p(x|s).$$

It can be proved $D(s_1,s_2)$ is always greater than or equal to zero. Thus, $D(s_1,s_2,)$ defined in (11) can be used as a distance measure between code tables.

Vector Quantization of Code Tables

As described above, a code table can be fully described by a vector consisting of $p(s)$ and $\{p(x|s)$, for all $x\}$. From this viewpoint, the code table merging is similar to a codebook design (or training) procedure for the vector quantization (VQ): choosing a small number of code vectors to represent a large number of vectors with minimum distortion. Subsequently, the code table merging can be done optimally using a LBG algorithm.

The LBG algorithm starts from a set of initial (estimated) code vectors and goes through many iterations of vector partition and centroid calculation, until a certain criterion is satisfied. In the vector partition, each of the code tables is assigned to its closest code vector. In the centroid calculation, a new optimal code vector (centroid) for each partition is calculated. Thus, the total distortion reduction of each iteration is greater than or equal to zero. The final set of code vectors is guaranteed to be at least a local optimum, if not a global optimum. The key steps for applying the LBG algorithm to the code table reduction are described below.

Initialization

The initial code vectors not only affect the number of iterations needed for the LBG algorithm to converge, but also affect the final result if some local optima other than the global optimum exist. Since the number of code tables obtained from the incremental tree extension is relatively small, a very good initial code vectors can be obtained by either of the following methods.

1. Merge the two closest code tables according to the distance measure of (11). This procedure is repeated iteratively until the desired number of code vectors is reached.
2. Merge the code table which has the smallest $p(s)$ with its closest code table. Same procedure is repeated until the desired number of code vectors is reached.

The first method gives us a very good initial guess of the code vectors, but its computational complexity grows proportionally to $N^3$ where N is the number of code tables. The second method is faster (with $N^2$ complexity) but offers a rougher estimation of the initial code vectors based on the rationale that the code tables with smaller $p(s)$ likely have smaller impact on the total coding rate. Roughly, the first method can be used when the number of code tables is under 200 or 300. If the number of code tables is greater than 200 or 300, the second method first to reduce the number of code tables to 200 or 300, and then using the first method afterward.

Centroid Calculation

After partitioning the code tables, the new code vector (centroid) of each partition $\Omega$ is calculated by:

$$p(x|s\epsilon\Omega) = \frac{\sum_{s\epsilon\Omega} p(s)p(x|s)}{\sum_{s\epsilon\Omega} p(s)}. \qquad (12)$$

This VQ technique can reduce the number of code tables significantly with only a minor rate increase penalty. For example, the number of code tables can be reduced from 361 to 15 with less than 1% of penalty. Such code table reduction drastically reduces the storage requirement for the implementation of high-order coding schemes.

Quantization of Conditioning Pixels

In high-order conditional coding schemes, some conditioning states may contain many symbols or pixels and each pixel may have many different values. For hardware implementation, these imply that a large number of bits are needed to address the states and a large number of states need to be identified, which may impose difficulty on a high-speed implementation. The prior art shows that the resolution of conditioning pixels can be reduced by uniform quantization. The prior art also shows such reduction by truncation (e.g., pixel values greater than 4 are truncated to 4).

As described herein, the resolution of conditioning pixels is reduced by merging the sibling leaves (in the conditioning tree) with "similar" code tables. The similarity is also based on the measure of (11). Different resolutions are allowed for different conditioning pixels. This approach can be viewed as an optimal non-uniform quantization of the conditioning pixels. As the resolution of the conditioning pixels is reduced, the number of conditioning states is reduced as well.

During code table reduction, some sibling leaves are automatically merged. In other words, some of the sibling leaves (states) are assigned the same code table after the LBG algorithm. However, since the minimal distance is the criterion considered in the LBG algorithm, some sibling leaves may belong to different partitions even though their conditional distributions are "quite" similar, but not similar enough to have them assigned to the same code table. Therefore, the results of the LBG algorithm are reviewed and adjustments are made to the code table assignment (or partition).

Each leaf (state) is assigned to the same code table used by its sibling state as long as the penalty (rate increase) is tolerable. After this process, a new set of partitions are obtained and the optimal code vector of each partition can be calculated by (12). According to the new partition, the values of each conditioning pixel are divided into a small number of groups and result in a non-uniform quantizer.

It is possible that two sibling subtrees become identical after this process and can be merged together. It is also possible that all the leaves growing out from a particular node use the same code table. Then, these leaves can be merged back into their branching node. The higher-order conditioning pixels (in the conditioning tree) need coarser representation. For example, the conditioning pixels from 6-th order to 11-th order need only to be identified as zero or non-zero (i.e., 1 bit).

The above approach provides a systematic way to reduce the resolution of the conditioning pixels while reducing the number of the conditioning states. Also, because of its non-uniform and multi-resolution features, it is considered to be more efficient than the previous approaches. For example, this method can reduce the number of conditioning bits from 55 to 21 and the number of conditioning states from 361 to 63. Thus, the hardware complexity is reduced dramatically. The rate increase due to both the code table reduction and the conditioning pixel quantization is only 1.2%.

Example

This high-order coding scheme was applied to a video signal after a 4-band subband decomposition. Two conditioning trees and their associated code tables were designed using 10 different pictures. One set was for high-band (LH, HL, and HH) signals, and the other for low-band (LL) DPCM residual signals. As shown in FIG. 3, the gain in coding efficiency approached to zero as the number of conditioning tree extensions increased.

Figure 4:
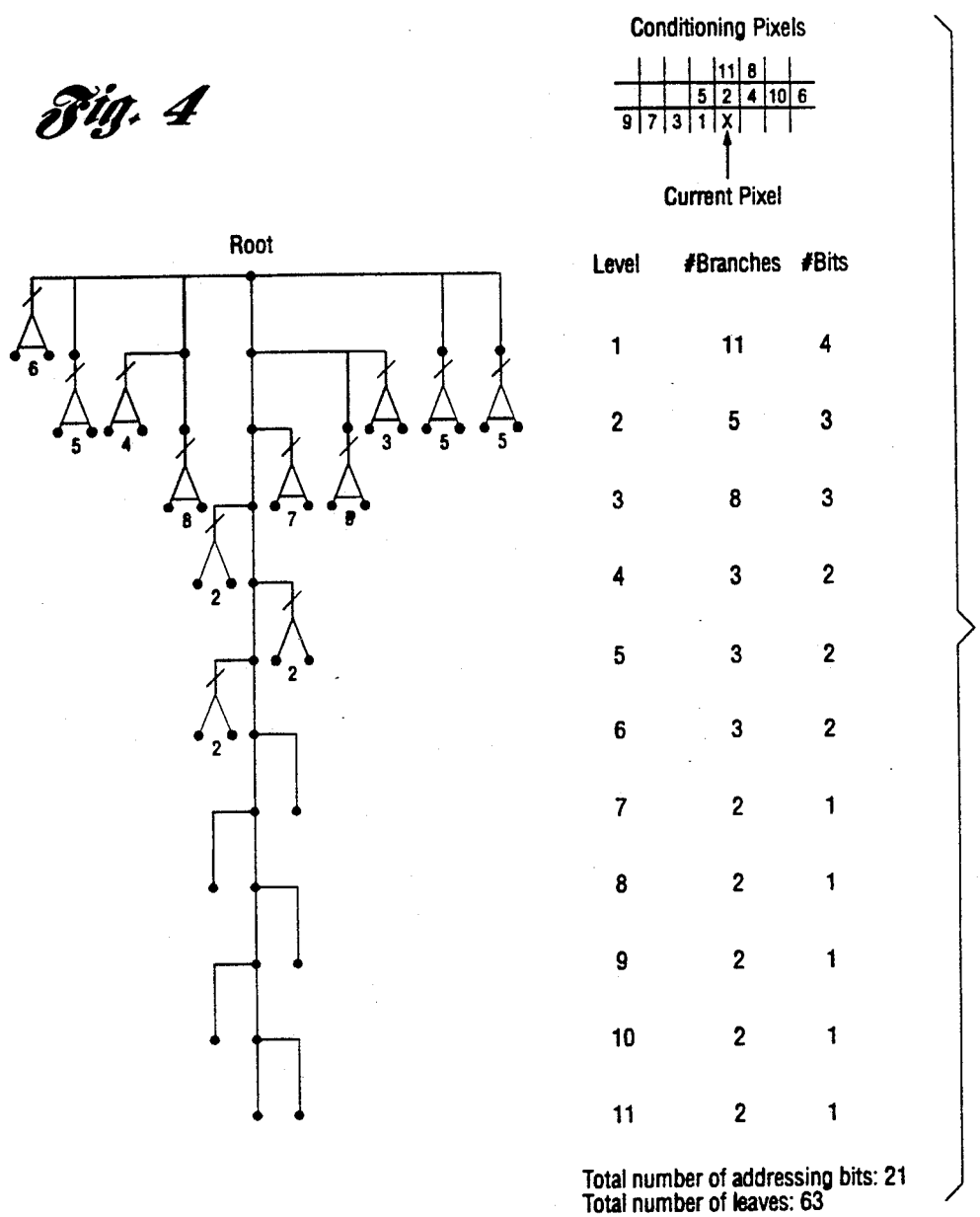
FIG. 4 illustrates a sample conditioning tree with a depth of 11 and 63 leaves (conditioning states)

Both high-band and low-band conditioning trees were chosen to extend 18 times where their incremental gain were very close to zero. With 21 different values of high-band pixels, the high-band conditioning tree grew 21 branches each time it was extended. It resulted in an 11-level tree with 361 leaves. After the code table reduction and the conditioning pixel quantization, the number of code tables was reduced from 361 to 15, the conditioning bits from 55 to 21, and the conditioning states from 361 to 63. The resulting conditioning tree is shown in FIG. 4. The coding rate was increased only by 1.02%. A conditioning pixel scanning pattern shown on the top-right corner of FIG. 4 was determined by a conditional mutual information criterion.

Figure 5:
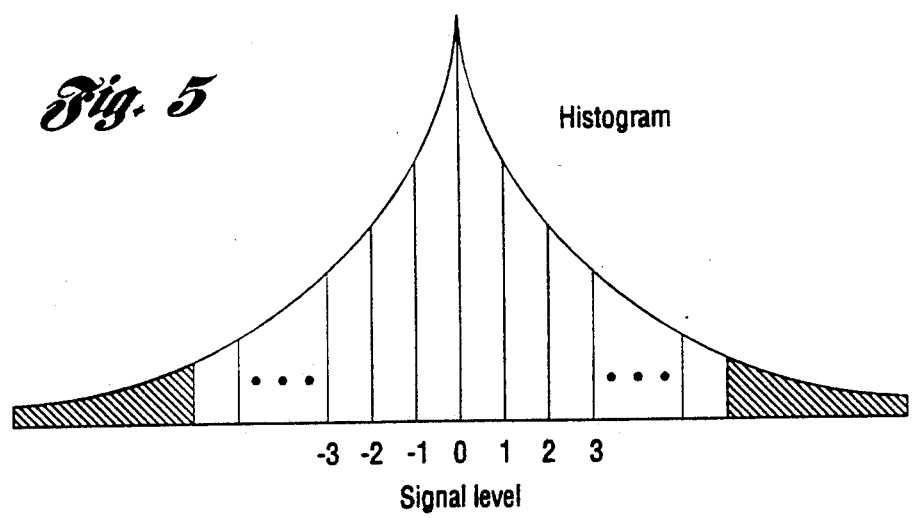
FIG. 5 is a sample histogram.

The conditioning tree design for the low-band DPCM residual signals is a little more complicated. The low-band DPCM residual signals needed to be quantized more finely. There are 83 different pixel values. A direct approach would grow 83 branches for each incremental tree extension and would result in a large number (1477) of conditioning states. The histogram of these signals has a shape as shown in FIG. 5. The conditioning pixels can be truncated to ±16 (i.e. 33 different values) with little penalty. Hence, 33 branches were grown each time of the tree extension. The resulting conditioning tree had 577 leaves but only two levels. After the code table reduction and the conditioning pixel quantization, the number of code tables was reduced from 577 to 14, the conditioning bits from 12 to 10, and the conditioning states from 577 to 217. The coding rate was increased only by 1.36%. Each code table still has 83 (not 33) entries. If further reduction of the code table size were desired, one could use a single code table (instead of 14) to code those infrequent entries. The penalty is small. For example, if one used a single code table to code the entries which are greater than 31 or less than −31, the coding rate would increase only about 1% but the total code table size is reduced by about 22%.

The coding rates of the 10 pictures by the high-order coding scheme and by the conventional run-length /Huffman coding scheme are listed in Table I on the following page. For the high-band signals, the coding gains of the present scheme over the run-length/Huffman scheme are from 8.23% to 21.70% with an average of 14.60%. For the low-band DPCM residual signals, the improvements are from 5.66% to 14.91% with an average of 10.06%. Overall, the coding gains are from 8.53% to 16.70% with an average of 11.87%.

TABLE I

| | Coding Results | | | | | | | | | |
|---|---|---|---|---|---|---|---|---|---|---|
| | hhi | renata | mit | nab | autum | boat | calen | ceer | pgpg | witc |
| Picture H | | | | | | | | | | |
| $R_r$ | 1.547 | 1.556 | 1.079 | 0.721 | 1.339 | 1.519 | 2.319 | 2.008 | 1.359 | 0.583 |
| $R_c$ | 1.376 | 1.305 | 0.941 | 0.587 | 1.126 | 1.295 | 2.128 | 1.789 | 1.142 | 0.457 |
| Δ (%) | 11.03 | 16.11 | 12.78 | 18.58 | 15.88 | 14.75 | 8.23 | 10.93 | 15.97 | 21.70 |
| Picture L | | | | | | | | | | |
| $R_r$ | 5.409 | 5.504 | 5.250 | 5.091 | 5.468 | 5.683 | 6.055 | 6.073 | 5.405 | 4.897 |
| $R_c$ | 4.841 | 5.147 | 4.611 | 4.381 | 5.159 | 5.011 | 5.517 | 5.519 | 5.017 | 4.167 |
| Δ (%) | 10.50 | 6.48 | 12.16 | 13.95 | 5.66 | 11.82 | 8.88 | 9.12 | 7.17 | 14.91 |
| Picture O | | | | | | | | | | |
| $R_r$ | 2.513 | 2.543 | 2.122 | 1.814 | 2.371 | 2.560 | 3.253 | 3.024 | 2.370 | 1.662 |
| $R_c$ | 2.243 | 2.266 | 1.859 | 1.536 | 2.134 | 2.224 | 2.976 | 2.721 | 2.110 | 1.384 |
| Δ (%) | 10.75 | 10.90 | 12.40 | 15.33 | 9.99 | 13.12 | 8.53 | 10.02 | 10.95 | 16.70 |

$R_r$: the coding rate (bits/pel) using run-length and Huffman coding scheme.
$R_c$: the coding rate (bits/pel) using our high-order conditional entropy coding scheme.
Δ (%): the percentage of improvement (100 × $(R_r - R_c)/R_r$).
H: High-band signals.
L: Low-band DPCM residual signals.
O: Overall

Hardware Architectures

Hardware architectures for the implementation of the high-order entropy codec system is described herein. Various techniques are presented for fast conditioning-state extraction and the design of several system components are described. A high-speed high-order entropy codec can be efficiently designed in ASICs (Application Specific Integrated Circuits) using today's low-cost VLSI technology. For applications where speed is not critical, the architecture is also suitable for implementation using discrete components.

The high-band conditioning tree as shown in FIG. 4 is used as an example to illustrate hardware architectures. However, the approach is general, and can also apply to other systems. In this example, the total number of code tables has been reduced to 15 by merging similar code tables. The conditioning tree contains 11 levels and needs 21 conditioning addressing bits.

The Overall System

Figure 6A:
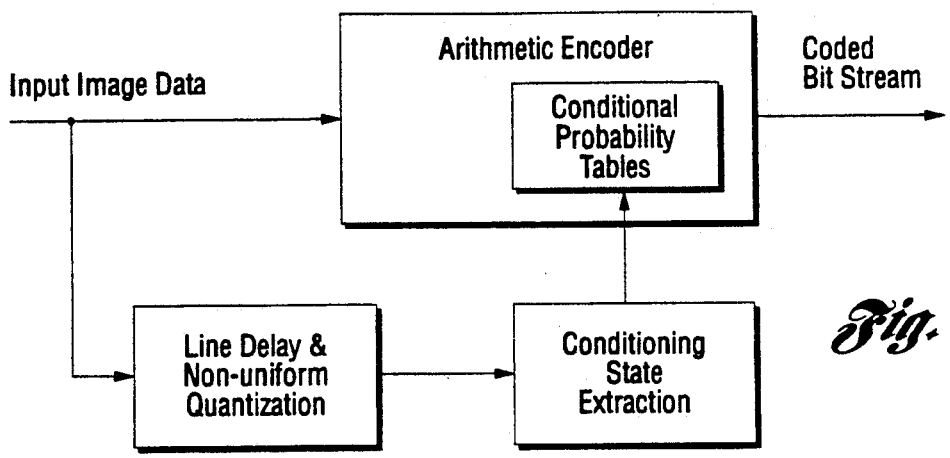
FIGS. 6a and 6b are system block diagrams for high-order conditional entropy encoder and decoder, respectively.
Figure 6B:
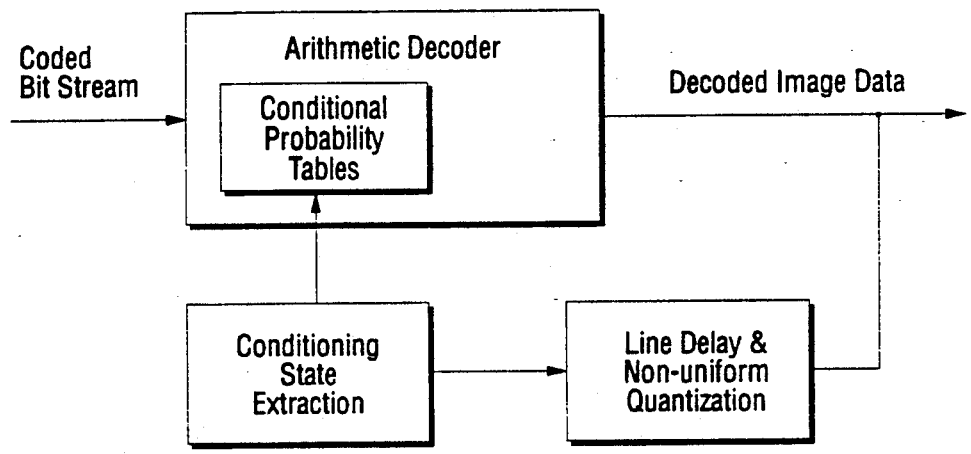

A system block diagram is shown in FIGS. 6a and 6b. The encoder of FIG. 6a includes a arithmetic coder, line-delays and non-uniform quantization, and conditioning state extraction circuitry.

The decoder of FIG. 6b includes the same functional blocks except that the arithmetic coder is replaced by the arithmetic decoder. The arithmetic coder and decoder can be replaced by a VLC coder and decoder when the coding performance of VLC is satisfactory Hereafter, the arithmetic coder and decoder are described for illustration purposes only.

In the encoder of FIG. 6a, the arithmetic encoder codes an input pixel according to its high-order conditional probability. The input pixels are also stored in the line-delay and non-uniformly quantized before being used to extract the conditioning state for encoding next input pixels.

In the decoder of FIG. 6b, the arithmetic decoder decodes the pixel according to the coded data and the conditioning state. The decoded pixels are also stored in the line-delay and non-uniform quantized as in the encoder before being used to extract the conditioning states for decoding next pixels. For proper operation, the decoder must extract the same conditioning state as the encoder. Thus, at the beginning of encoding and decoding, all internal memories in both the encoder and decoder should be initialized to the same state. The coding operation also has to be reset periodically to confine possible error propagation due to transmission errors. Besides setting the encoder and decoder to the same state, the reset operation of the encoder also needs to mark in an unambiguous way the beginning of the next coded segment. Thus, if there is a transmission error, the decoder will recover the proper decoding operation upon the next coded segment.

Compared to a zero-order arithmetic codec, the extra circuitry for the high-order system of the present invention includes the conditioning state extraction circuitry, the line-delay and non-uniform quantization circuitry, and extra code tables. These extra circuits are easy to design and, thus, do not add much complexity to the overall system. The implementations of the arithmetic coder or VLC coder have been described previously and will not be addressed here. The implementation of the other system components are described hereinbelow.

Because there is a feedback-loop in the decoder of FIG. 6b, the previous decoded pixels are needed for extracting the conditioning state for decoding the current pixel. Thus, the decoding of the current pixel depends on previously decoded pixels. The critical path is from the arithmetic decoding of the current pixel to the non-uniform quantization, and the conditioning state extraction. Due to the feedback loop, this path cannot be pipelined. For many applications where speed is not critical, this longer path is not a major concern. For systems which require high-speed operations, techniques for fast conditioning state extraction are needed. These are discussed hereinbelow. The non-uniform quantization requires only a few logic gates and does not cause much delay and, thus, will not be further discussed.

Fast Conditioning State Extraction

The conditioning state extraction can be implemented by a finite state machine. The conditioning pixels are used one by one to trace down the conditioning tree sequentially until a leaf is reached. However, in this sequential tree-tracing method, several clock cycles are needed to extract the final state. Since the conditioning state needs to be generated for every input pixel, this serial tree-tracing approach requires a clock rate much higher than the pixel rate. Moreover, due to different depths of leaves, the number of clock cycles needed to reach different leaves is not constant, which will make the hardware design more complicated.

Since the conditioning state is a function of the conditioning pixels, it can be generated by a single table-lookup addressed by all the bits of the conditioning pixels. This parallel table-lookup approach generates a conditioning state every clock cycle regardless of the depth of the leaves, making high-speed state-extraction possible. Theoretically, the look-up table can be implemented by a ROM (Read-Only-Memory). However, with 21 bits from the conditioning pixels, the ROM size would be $2^{21}$ words which is too large for practical implementations.

Because of the incremental tree extension, the conditioning tree is not a full tree but a rather sparse one. The look-up table can be more efficiently implemented using a PLA (Programmable Logic Array). The PLA contains an AND-plane and an OR-plane. The AND-plane stores the patterns of the conditioning pixels which lead to the leaves of the tree. The OR-plane stores the index of code tables. The PLA performs a parallel pattern matching to extract the conditioning state.

Compared to a ROM look-up table which implements a full tree, the PLA look-up table efficiently implements the incrementally extended sparse tree. Since the incrementally extended tree has substantially fewer leaves than the full tree, the PLA contains correspondingly fewer entries. In the present example, the PLA only contains 63 entries corresponding to the 63 leaves in FIG. 4. Each entry contains 4 bits to indicate which one of the 15 tables should be used.

Although the number of entries in the PLA look-up table is greatly reduced compared to that of the ROM look-up table, the number of addressing bits is still 21. Moreover, for some applications, even more addressing bits may be needed. The relatively large number of addressing bits make the implementation of PLA relatively difficult and slow. For high-speed systems, it is desirable to further limit the number of addressing bits so that a high-speed PLA can be designed to reduce the delay in the critical path.

Figure 7:
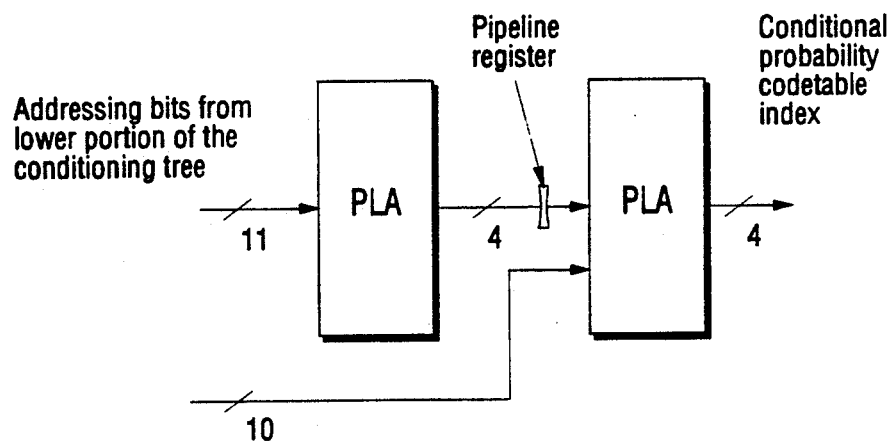
FIG. 7 illustrates a two-stage pipelined structure for fast conditioning state extraction corresponding to the example in FIG. 4.

Due to the incremental tree extension, code table reduction, and non-uniform quantization of conditioning pixels, the lower part of the conditioning tree is very sparse. For the example shown in FIG. 4, after the 3rd-level, only one node is further extended. Also, although only 12 leaves exist after the 3rd-level, 11-bits are used to address these leaves. Furthermore, these addressing bits are all from those conditioning pixels which are available a few clock-cycles ahead. Thus, it is possible to implement first the lower part of the conditioning tree by a separate pipelined PLA This PLA is very small and contains only 11 addressing bits and 12 entries corresponding to the 12 leaves. Alternatively, it can also be efficiently realized with random logic and implemented together with the non-uniform quantization circuit. Since there are only 12 leaves, the output of this first stage can be represented in 4 bits. These 4 bits can be pipelined and combined with the 10 addressing bits from the upper part of the tree to address the 2nd-stage PLA as shown in FIG. 7. In this pipelined structure, the speed-critical 2nd-stage PLA only has 14 addressing bits and 63 entries. Such a small PLA is relatively easy to design for high speed operations. In the actual implementation, since the current decoded pixel needs to propagate through the arithmetic decoder and the non-uniform quantization circuitry, the pipelining may not be needed. In Section 7, the two-stage pipelined structure will be extended for more general systems.

Line-Delay

Figure 8:
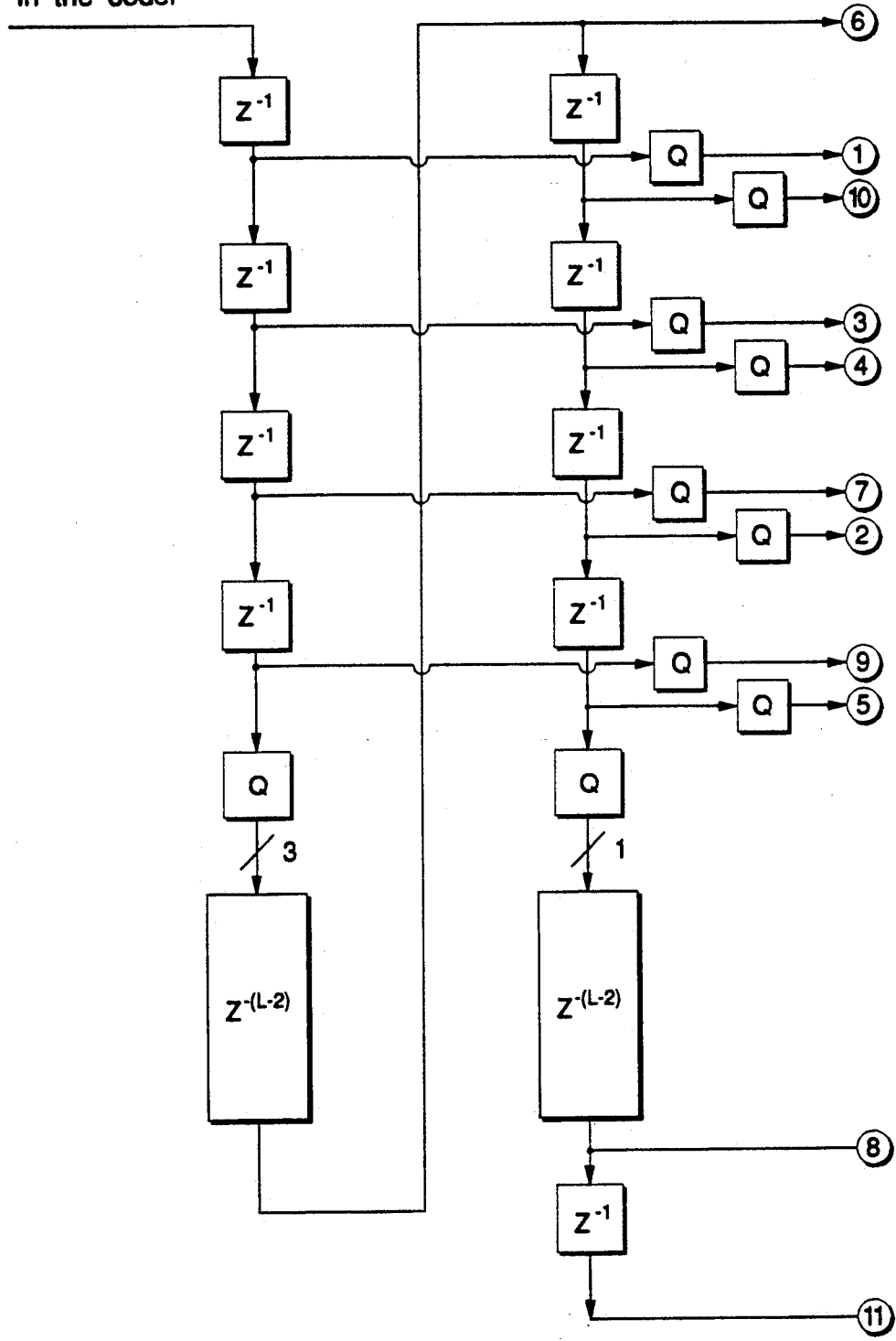
FIG. 8 illustrates the delay-line and non-uniform quantization for the example of FIG. 4.

The line-delay module of the encoder of FIG. 6a preferably contains two line-delays as shown in FIG. 8 for storing the current pixel and its conditioning pixels. The decoder of FIG. 6b has a line-delay module almost identical to this module except the first delay is absent since the current pixel is not decoded yet. Due to the non-uniform quantization of conditioning pixels, the word-lengths of the line-delays are greatly reduced. In the present example, the word-lengths for the first and second line-delays only need to be 3-bit and 1-bit wide, respectively. Thus, the area for implementing the line-delays is greatly reduced compared to full resolution line-delays. As an example, if a video line contains 1920 pixels, only about 8 kbits of memory cells are needed for the two line-delays.

The line-delay can be implemented using RAMs (Random Access Memories) or shift registers. Compared to RAM-based approaches, the shift-register based approaches usually have a speed advantage but suffer an area and power penalty. The prior art illustrates a 16-kbit programmable line-delay implemented using a RAM-based approach with 2 $\mu$m standard CMOS technology and operating at 50 MHz. The size and speed of the required line-delay should not cause difficulty in the design of the overall system.

At the beginning and the end of each video line, some of the conditioning pixels are outside the picture and thus not available. Using the line-delay shown in FIG. 8, the pixels at the end of previous lines are used as the conditioning pixels for the beginning pixels of the current line. The pixels at the beginning of the current line and the previous line are used as the conditioning pixels for the ending pixels of the current line. Although these conditioning pixels may not produce optimum conditional probability, the performance degradation is expected to be negligible since the boundary pixels only represent a small percentage of the pixels in the overall picture. Another way to take care of the boundary condition is to include extra words of memory at the beginning of each line-delay to provide the conditioning pixels that are outside the frame boundary. For proper initialization, pixels of value "0" are shifted into these extra words of memory before the first pixel of the line.

Since the line-delay and the PLA all have a very regular structure, the overhead of the high-order codec described herein requires minimal design efforts. A compiler may be employed to generate the required line-delay and PLAs automatically. For systems which do not require very high speed operations, discrete components can also be used to implement the system.

Multistage Structure For State Extraction

The two-stage pipelined structure shown above can be extended to more stages for systems where the number of addressing bits is very large. Usually, a very deep conditioning tree requires more addressing bits. In this situation, because of the nature of the complexity reduction techniques used, the higher-order parts of the conditioning tree are rather sparse. Also, they are only addressed by conditioning pixels which are available several clock-cycles ahead, and thus can be pipelined.

Figure 9:
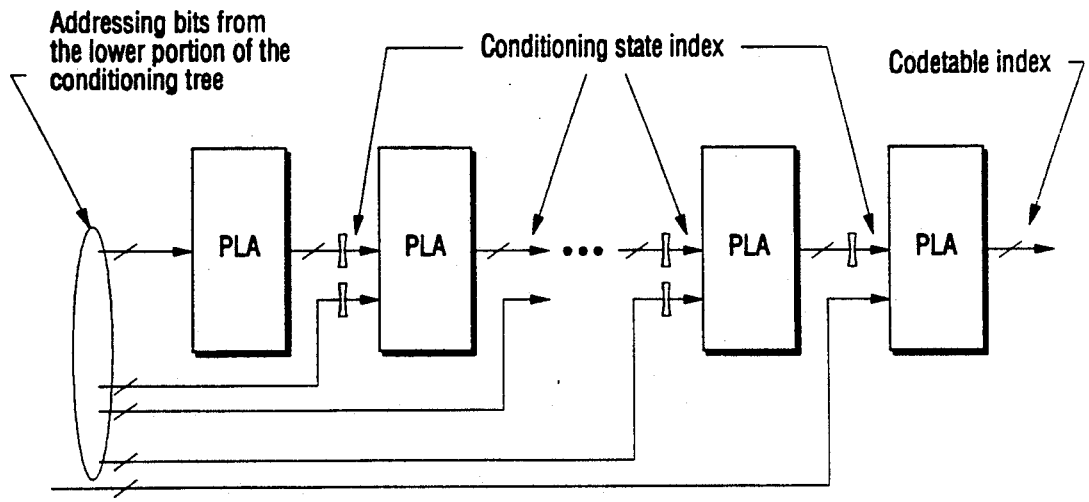
FIG. 9 illustrates a general multistage pipelined structure for high-speed conditioning state extraction.

A general multistage pipelined structure for high-speed conditioning state extraction is shown in FIG. 9. In this approach, the conditioning tree is partitioned into multiple stages, each stage may contain one or several levels of the tree. Each stage is implemented by a PLA. The number of pipelined stages depends on the desired number of addressing bits of each PLA, the speed of the PLA, and the number of clock-cycles allowed for pipelining. The top portion of the tree is implemented by the last stage PLA because it involves the most current decoded pixel and thus should not be pipelined in the feedback-loop. The higher-order levels of the tree are implemented first and are pipe-lined. The output of each stage gives the indices of the paths leading to the leaves up to that stage. These index bits are combined with the next stage addressing bits to address the next stage PLA. Essentially, the conditioning tree is flattened from the bottom stage to the top stage, and the paths leading to the leaves are coded more efficiently. During this process, the sibling leaves which use the same code table can also be merged. Since the higher-order parts of the tree are sparse, the numbers of the indices are limited. Thus, the addressing bits of the last-stage PLA which is the speed-critical part can be much reduced resulting in higher speed implementation.

The resultant multistage structure is very regular and no extra control circuitry is required. Due to the regularity, the pipelined structure, and the small size PLAs, efficient and high-speed conditioning state extraction can be achieved with minimal design efforts.

Figure 10:
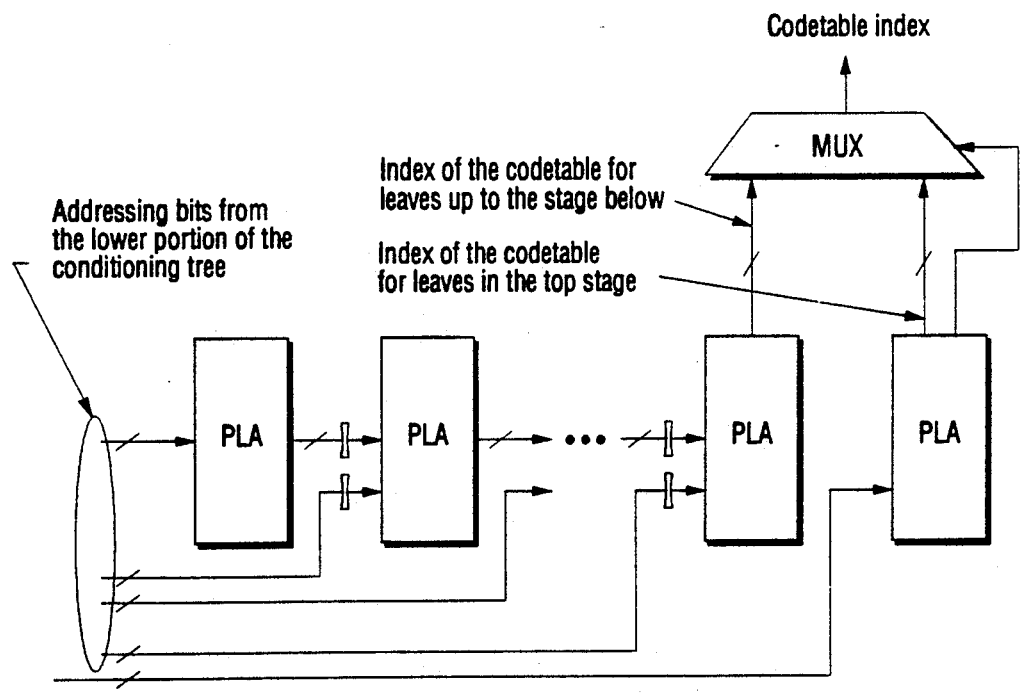
FIG. 10 illustrates a variation of the multistage pipelined structure to further reduce the size of the last stage PLA.

Other variations of this basic structure are also possible. One such variation is shown in FIG. 10. In the basic structure shown in FIG. 9, the paths leading to leaves are extended from the bottom of the tree to the top of the tree. The indices of these paths are passed from the front stags to the final stage because it results in a regular structure and the number of these paths usually is small. In the structure shown in FIG. 10, these paths are not passed to the final stage. Instead, the indices of these paths and the indices of the paths leading to the leaves in the final stage are connected to an output multiplexor. Depending on the result of the final stage output, either the indices of the final stage or the previous stage will be selected. With this structure, the number of addressing bits and entries of the final stage PLA becomes smaller. However, the structure is less regular and requires some control circuitry. It is suitable for the cases where the number of addressing bits and entries of the final stage PLA needs to be further reduced or the number of indices from the previous stage is large.

Several key innovations for practical implementation of high-order conditional entropy coding are described herein. The proposed code table reduction technique can reduce the required number of code tables to the order of a few tens, which is one of the key steps toward high-speed realization of the high-order conditional entropy coding. With the help of non-uniform quantization of conditioning pixels, the number of addressing bits and the number of conditioning states are both reduced leading to smaller and faster state extraction circuitry. The proposed pattern matching based techniques is important for high-speed state extraction. On the other hand, the proposed pipelined structure for multistage state extraction extend the usefulness of such hardware to cases where many conditioning pixels are involved if a very high-speed operation is required. Using these innovations, a high-order entropy codec can be practically implemented with ASICs using today's low-cost VLSI technology.

While the best mode for carrying out the invention has been described in detail, those familiar with the art to which this invention relates will recognize various alternative designs and embodiments for practicing the invention as defined by the following claims.

What is claimed is:

1. A method for compressing data in a data transmission system, the method comprising the steps of:
    generating a reduced number of code tables containing statistical information for translating between first and second sets of data, the first set of data representing source symbols and the second set of data representing corresponding coded bit streams;
    temporarily storing the source symbols to obtain a current symbol and its conditional symbols;
    generating a reduced number of conditioning states for the source symbols;
    non-uniformly quantizing the conditioning symbols to obtain quantized conditioning symbols;
    extracting a conditioning state from the reduced number of conditioning states based on the quantized conditioning symbols;
    selecting a code table from the reduced number of code tables based on the extracted conditioning state;
    determining a code from the selected code table for the current symbol; and
    encoding the current symbol based on the determined code to obtain a coded bit stream.

2. The method of claim 1 wherein the step of extracting includes the step of performing a multistage, parallel pattern matching algorithm to extract the conditioning state.

3. The method as claimed in claim 1 wherein the step of generating a reduced number of conditioning states includes the steps of generating a plurality of conditioning states by an incremental tree extension algorithm and reducing the number of conditioning states to obtain the reduced number of conditioning states.

4. The method of claim 1 wherein the symbols are pixels.

5. A system for compressing data in a data transmission system, the system comprising:
    means for storing a reduced number of code tables containing statistical information for translating between first and second sets of data, the first set of data representing source symbols and the second set of data representing corresponding coded bit streams;
    means for temporarily storing the source symbols to obtain a current symbol and its conditional symbols;
    means for storing a reduced number of conditioning states for the source symbols;
    means for non-uniformly quantizing the conditioning symbols to obtain quantized conditioning symbols;
    means for extracting a conditioning state from the reduced number of conditioning states based on the quantized conditioning symbols;
    means for selecting a code table from the reduced number of code tables based on the extracted conditioning state;
    means for determining a code from the selected code table for the current symbol; and
    means for encoding the current symbol based on the determined code to obtain a coded bit stream.

6. The system of claim 5 wherein the means for extracting includes a multistage pipelined PLA for performing a multistage, parallel pattern matching algorithm to extract the conditioning state.

7. The system as claimed in claim 5 further comprising means for performing an incremental tree extension algorithm to obtain a plurality of conditioning states and means for reducing the number of conditioning states to obtain the reduced number of conditioning states.

8. The method of claim 5 wherein the symbols are pixels.

9. A method for decompressing data in a data transmission system, the method comprising the steps of:
    generating a reduced number of code tables containing statistical information for translating between first and second sets of data, the first set of data representing source symbols and the second set of data representing corresponding coded bit streams;
    temporarily storing the source symbols to obtain a current symbol and its conditional symbols;
    generating a reduced number of conditioning states for the source symbols;
    non-uniformly quantizing the conditioning symbols to obtain quantized conditioning symbols;
    extracting a conditioning state from the reduced number of conditioning states based on the quantized conditioning symbols;
    selecting a code table from the reduced number of code tables based on the extracted conditioning state;
    determining a code from the selected code table for the current coded bit stream; and
    decoding the current coded bit stream based on the determined code to obtain a decoded symbol.

10. The method of claim 9 wherein the step of extracting includes the step of performing a multistage, parallel pattern matching algorithm to extract the conditioning state.

11. The method as claimed in claim 9 wherein the step of generating a reduced number of conditioning states includes the steps of generating a plurality of conditioning states by an incremental tree extension algorithm and reducing the number of conditioning states to obtain the reduced number of conditioning states.

12. The method of claim 9 wherein the symbols are pixels.

13. A system for decompressing data in a data transmission system, the system comprising:
    means for storing a reduced number of code tables containing statistical information for translating between first and second sets of data, the first set of data representing source symbols and the second set of data representing corresponding coded bit streams;

means for temporarily storing the source symbols to obtain a current symbol and its conditional symbols;

means for storing a reduced number of conditioning states for the source symbols;

means for non-uniformly quantizing the conditioning symbols to obtain quantized conditioning symbols;

means for extracting a conditioning state from the reduced number of conditioning states based on the quantized conditioning symbols;

means for selecting a code table from the reduced number of code tables based on the extracted conditioning state;

means for determining a code from the selected code table for the current coded bit stream; and means for decoding the current coded bit stream based on the determined code to obtain a decoded symbol.

14. The system of claim 13 wherein the means for extracting includes a multistage pipelined PLA for performing a multistage, parallel pattern matching algorithm to extract the conditioning state.

15. The system as claimed in claim 13 further comprising means for performing an incremental tree extension algorithm to obtain a plurality of conditioning states and means for reducing the number of conditioning states to obtain the reduced number of conditioning states.

16. The system as claimed in claim 13 wherein the symbols are pixels.

* * * * *